US006400566B1

(12) United States Patent
Ootori

(10) Patent No.: US 6,400,566 B1
(45) Date of Patent: Jun. 4, 2002

(54) ELECTRONIC DEVICE WITH HEAT GENERATING PARTS AND HEAT ABSORBING PARTS

(75) Inventor: Yasuhiro Ootori, Kanagawa (JP)

(73) Assignee: Sony Computer Entertainment, Inc., Tokyo (JP)

( * ) Notice: Subject to any disclaimer, the term of this patent is extended or adjusted under 35 U.S.C. 154(b) by 0 days.

(21) Appl. No.: 09/655,210

(22) Filed: Sep. 5, 2000

(30) Foreign Application Priority Data

Sep. 6, 1999 (JP) .......................................... 11-251656

(51) Int. Cl.[7] ................................................. H05H 7/20
(52) U.S. Cl. ....................................... 361/695; 454/184
(58) Field of Search ................. 62/259.2; 361/687–688, 361/690, 694–695, 692, 704, 710, 715; 454/184

(56) References Cited

U.S. PATENT DOCUMENTS

| | | |
|---|---|---|
| 5,287,244 A | 2/1994 | Hileman et al. |
| 5,731,952 A | 3/1998 | Ohgami et al. |
| 5,793,608 A | 8/1998 | Winick et al. |
| 5,901,040 A | 5/1999 | Cromwell et al. |
| 6,134,104 A * | 10/2000 | Mohi et al. ................ 361/690 |

FOREIGN PATENT DOCUMENTS

| | | |
|---|---|---|
| JP | 7-106782 | 4/1995 |
| TW | 82211664 TW | 2/1994 |

* cited by examiner

Primary Examiner—Gregory Thompson
(74) Attorney, Agent, or Firm—Rosenman & Colin LLP

(57) ABSTRACT

It is an object of the present invention to provide an electronic device which realizes efficient cooling of heat-generation components and which can be downsized. According to the electronic device of the present invention, a rectangular-shaped heat sink that absorbs heat of the CPU and is placed in a cooling air intake channel (71) upstream of the power source unit. By blowing low-temperature cooling air that does not contain heat radiating from the power source unit onto the rectangular heat sink, the rectangular heat sink is cooled, and CPU heat dissipation is promoted. In this way, the CPU can be efficiently cooled so that the electronic device can be made smaller than conventional devices of the foregoing type.

9 Claims, 11 Drawing Sheets

US 6,400,566 B1

ELECTRONIC DEVICE WITH HEAT GENERATING PARTS AND HEAT ABSORBING PARTS

FIELD OF THE INVENTION

The present invention relates to an electronic device that has heat-generating parts which give off heat and a power supply unit that supplies electric power to the at-generating parts.

BACKGROUND OF THE INVENTION

There has been a demand for higher speed in computation and other processing capacity in CPU (central processing unit) and other electronic components of video game devices, personal computers, and other electronic devices in order to process an enormous amount of multimedia information at high speed.

When one tries to increase the speed of processing capacity, the CPU itself generates more heat, because of the higher speed of signal transmission and reception and more complicated wiring within the CPU, and greater amount of heat generated from its elements. Increased heat generation raises the temperature inside the device, which leads to instability in the operation not just of the CPU but of other electronic components as well. This leads to a demand for electronic components that shed such heat, in other words, for high-efficiency cooling methods for heat-generating parts.

On the other hand, for portability and ease of use, progress is being made in reducing the size of electronic devices themselves by reducing their volume. Moreover, reducing their size reduces the space inside the electronic devices, and heat from heat-generating components tends to quickly raise the temperature inside the device, so along with reducing the size of electronic devices, what is required is a structure that efficiently cools the electronic components that generate heat.

SUMMARY OF THE INVENTION

It is an object of this invention to provide an electronic device whose heat-generating components are efficiently cooled and at the same time can be made smaller.

To obtain the above and other objects, the electronic device of the present invention includes heat-generating components that emit heat; a power supply unit that supplies electric power to said heat-generating components. Cooling channels for introducing air from outside of the device as cooling air into an interior of the electronic device and cooling the interior of the electronic device with the cooling air; and cooling members cooling said heat-generating components, wherein the cooling members are arranged in a cooling channel upstream from said power source unit.

Here, as cooling members there are parts of the device, that absorb heat released from heat-generating components and release heat to the outside, thereby cooling the heat-generating components.

With such an electronic device, the power source unit to which power is supplied from an external power source also generates heat, so if the power source unit is placed upstream in the cooling channel, heat emanated from the power source unit will blow onto the heat-generating components together with the cooling air, making it impossible to efficiently cool the heat-generating components.

Thus, placing a cooling member in the cooling channel upstream of the power source unit makes it possible to blow onto the cooling member low-temperature cooling air that does not contain the heat emanated from the power source unit, which makes it possible to efficiently cool the CPU and other heat-generating components.

Since the heat-generating components can be cooled efficiently, the electronic device can be made smaller.

In the foregoing, it is desirable that the cooling members be composed so as to include a heat sink that absorbs heat emanated from heat-generating components and releases this heat to the interior of the device.

In this way, heat emitted from the heat-generating components is forcibly released by the heat sink into the interior of the device, and if one uses a heat sink that has a large surface area, the heat sink can actively absorb and release the heat, thereby further improving the efficiency with which the heat-generating components are cooled.

Also, it is desirable that the heat sink and heat-generating components be connected by heat conducting members.

Here, the heat conducting members can be manufactured from aluminum by die casting.

In this way, the heat conducting members promote the transmission of heat from the heat-generating components to the heat sink.

Even, if the positioning of the heat sink and heat-generating components is separated from the positioning of the other components, the heat conducting members can securely connect the heat sink and the heat-generating components, which makes it possible to surely cool the heat-generating components.

Moreover, the electronic device of the present invention may include heat-generating components that emit heat, a power source unit that supplies power to the heat-generating components, wherein the heat-generating components are arranged at the bottom of the interior of the device when the electronic device is in horizontal orientation.

According to such an electronic device, since, when the electronic device is put into horizontal orientation, with the heat-generating components is arranged at the bottom of the interior of the electronic device, heat emitted by the heat-generating components can escape upward in the electronic device, which promotes cooling of the heat-generating components. This can improve the efficiency with which the heat-generating components are cooled. And because the heat-generating components are cooled efficiently, the device can be made smaller.

DETAILED DESCRIPTION OF THE PREFERRED EMBODIMENT

In the following, with reference to the drawings, an embodiment of this invention will be explained.

(1) Overall Arrangement of the Device

Figure 1:
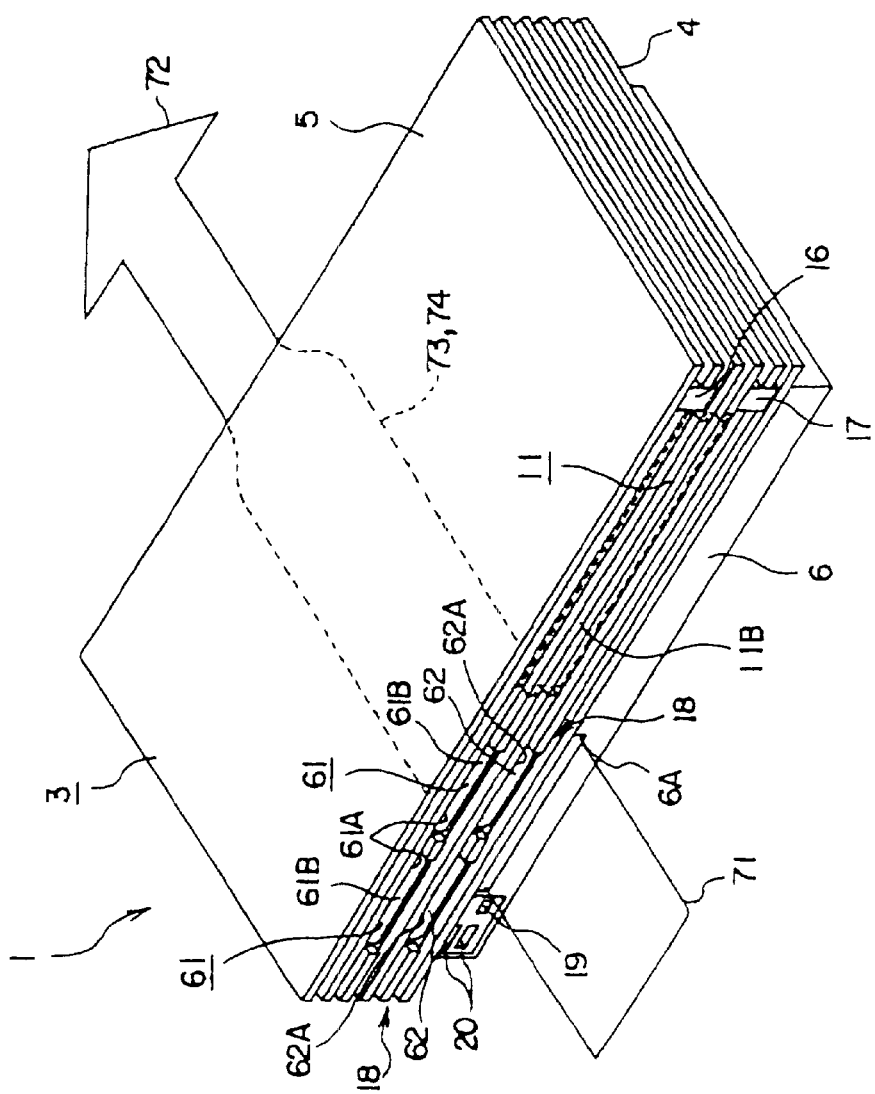
FIG. 1 is a schematic, perspective view of a video game device of an embodiment of the present invention.
Figure 2:
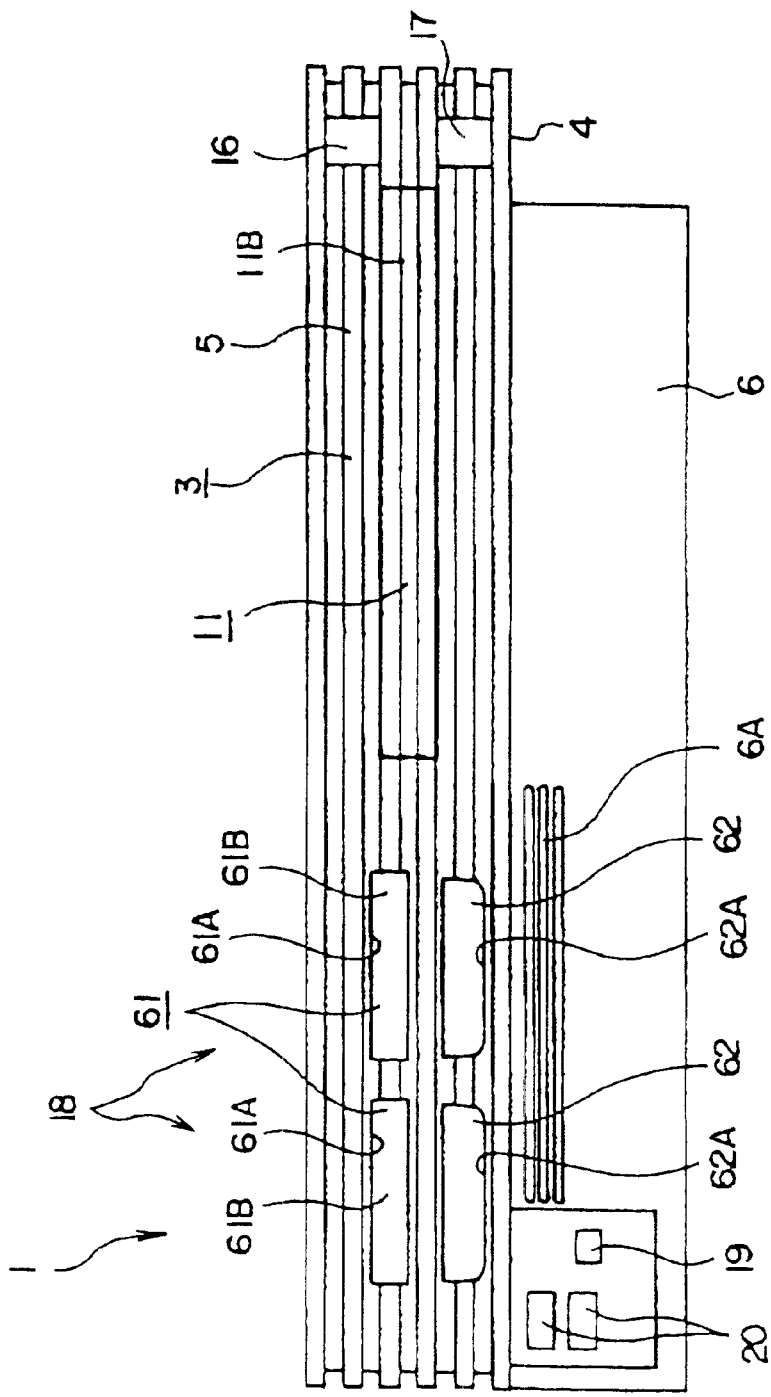
FIG. 2 is a front view of the video game device of FIG. 1.
Figure 3:
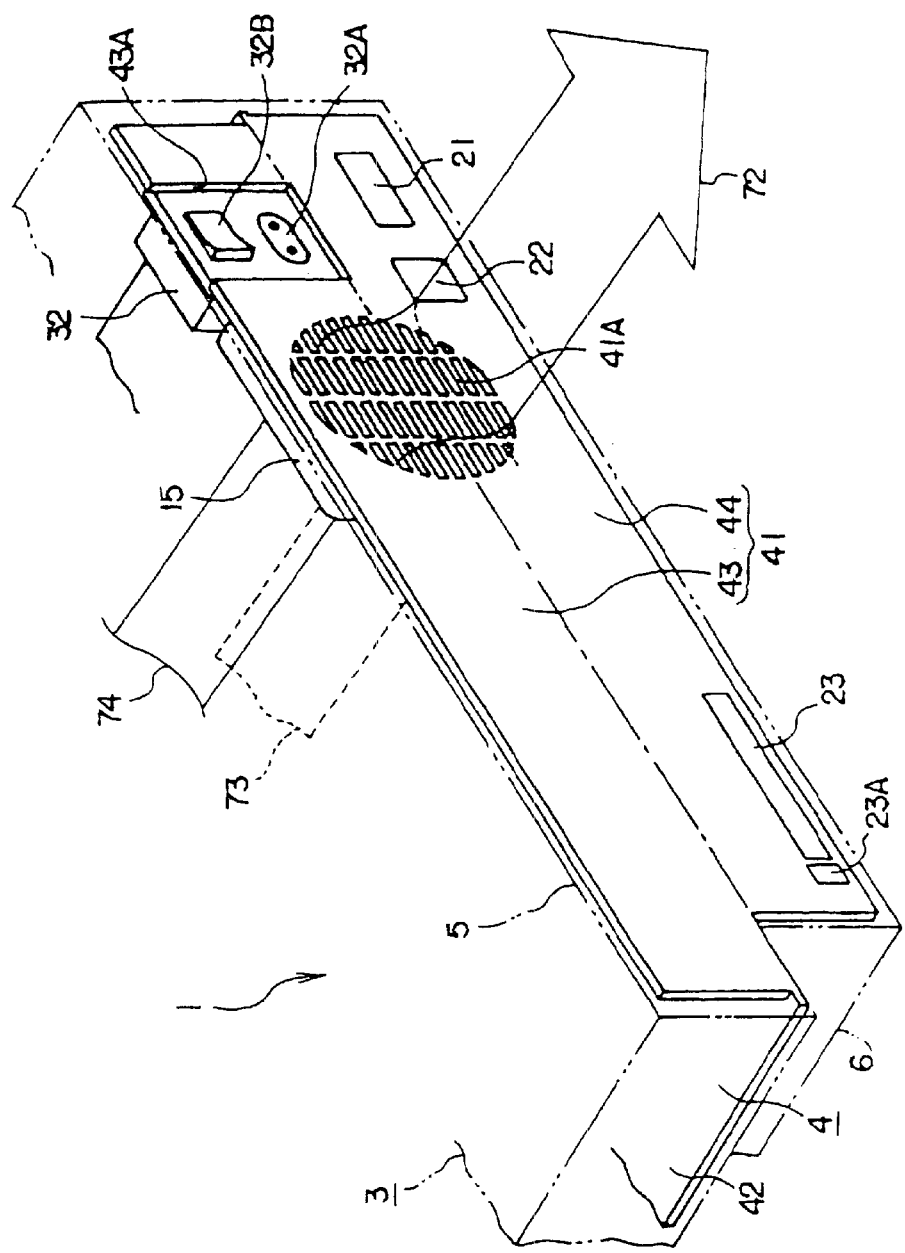
FIG. 3 is a perspective view of the video game device of FIGS. 1 and 2.
Figure 4:
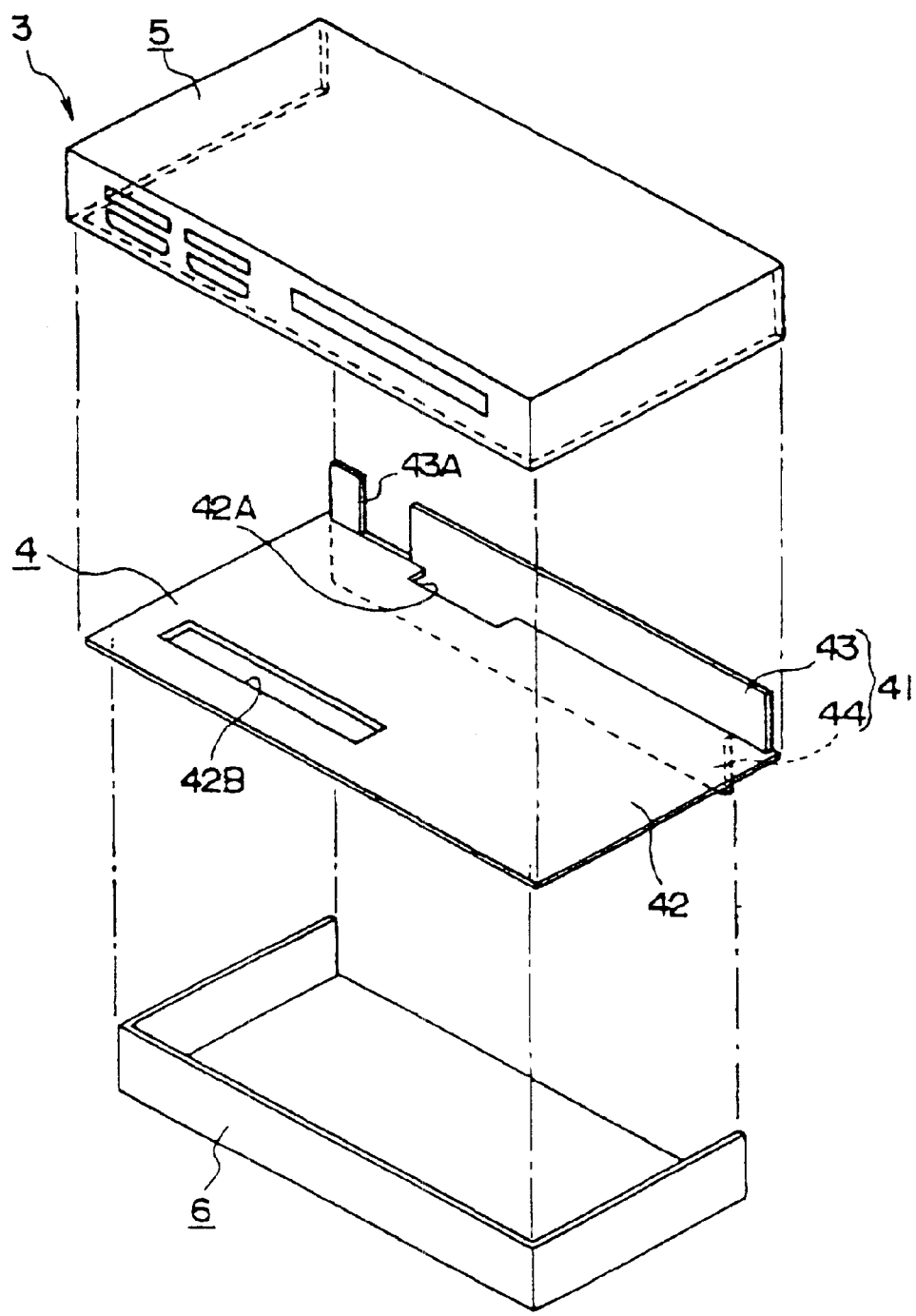
FIG. 4 is an exploded perspective view showing a housing of the electronic device of the present invention.
Figure 5:
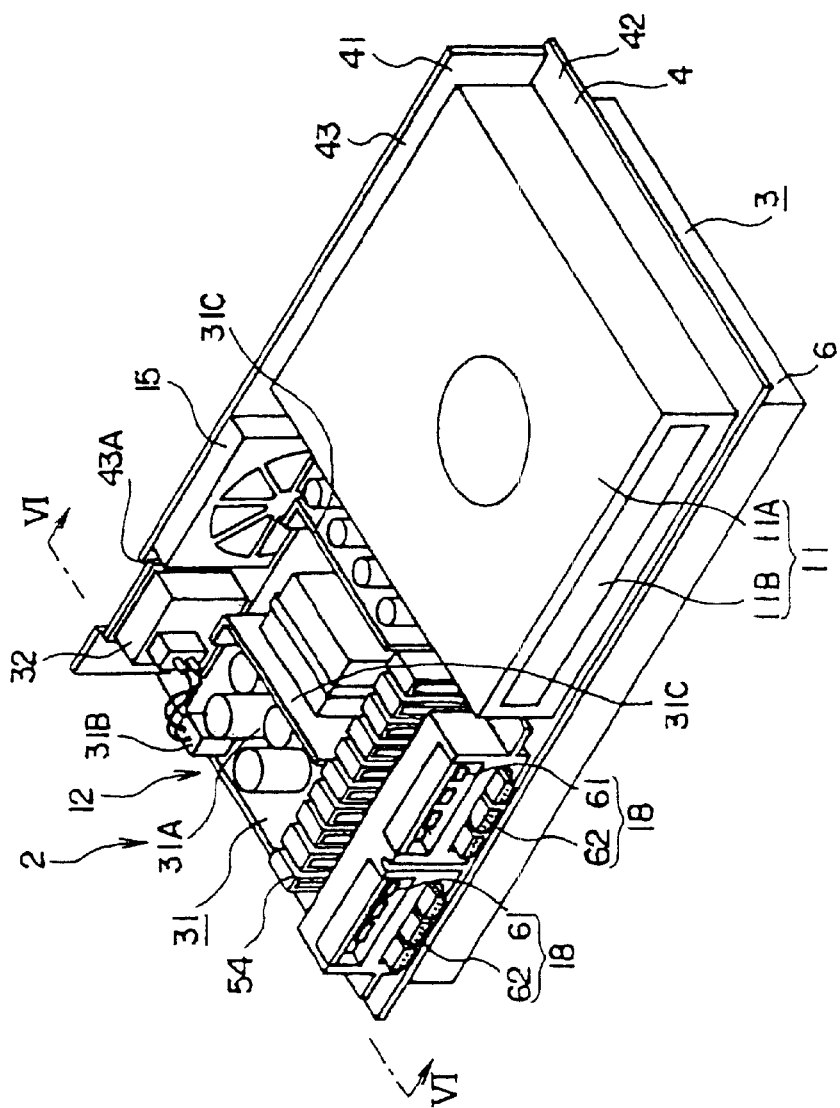
FIG. 5 is a perspective view of an internal structure of the video game device of the preceding Figures.

FIGS. 1 to 5 are schematic views of a video game device 1, which is an electronic device of an embodiment of the present invention, wherein FIG. 1 is a perspective view of device 1 seen from above, FIG. 2 is a front view of device 1 seen from the front, FIG. 3 is a perspective view of device 1 seen from the rear, FIG. 4 is an exploded perspective view of a housing 3, and FIG. 5 is a perspective view of the interior of device 1 seen from above.

Video game device 1, for example, reads a game program recorded on an optical disk or other medium and executes it according to instructions from the users (game players). "Executing a game" means mainly controlling the progress of the game as well as display and sound.

Video game device 1 includes a main body 2 of the device and a housing 3 for a video game device (hereinafter referred to as housing 3) which houses the main body 2.

As shown in FIG. 4, housing 3 has a central chassis 4, in which a main body 2 is provided, and which has an upper case 5 and a lower case 6 serving as a housing member that holds central chassis 4 between them and house the main body 2. The central chassis 4 is formed in a square on the plane and in roughly L shape in front.

As shown in FIG. 1, on the front right side (the right side as seen from the front) of upper case 5 is provided a disk device 11, which controls the action of a CD-ROM (compact disk read-only memory), DVD-ROM (digital video disk read-only memory), or another optical disk which is a storage medium on which video game application programs are recorded, and a disk tray 11B of the disk device 11 is exposed.

On the right side (the right side as seen from the front) of disk tray 11B are arranged, on top and a bottom, a power switch 16 and a tray operation switch 17 for performing the operation of inserting the disk tray 11B into and ejecting it from upper case 5.

On the front left side (the left side as seen from the front) of upper case 5, two slots 18 are exposed. Each slot 18 has a memory card insertion unit 61 positioned at the top and a controller connection unit 62 positioned at the bottom.

A memory card or other external auxiliary memory device is inserted into memory card insertion unit 61, and its insertion hole 61A (FIG. 2) is formed in the shape of a rectangle that is long in its horizontal direction. Provided on this memory card insertion unit 61 is a shutter 61B for protecting the connection terminal that is provided inside it.

Controller connection unit 62 is an input-output terminal for inputting input signals and outputting output signals. A connection terminal is connected to the controller connection unit. The connection terminal is formed at the end of a controller cable that extends from a controller that is an operation means. Its insertion hole 62A (FIG. 1) is formed approximately in the shape of a rectangle that is long in its longitudinal direction, with the lower corners shaped rounder than the upper corners.

By forming insertion hole 62A in this way, the connection terminal of the controller is prevent from being connected upside-down. And because the shape of insertion hole 62A is given a different structure from the shape of insertion hole 61A for a memory card insertion unit 61, there is no danger of erroneously inserting an external auxiliary memory device into insertion hole 62A.

Having two of controller connection units 62 makes it possible to connect two controllers, allowing two users to play competitive games, etc.

The results of operating each controller connected to controller connection unit 62 are recorded in an external auxiliary memory device inserted into memory card insertion unit 61 located above each controller.

The front surface and right-side surface (the side surface on the right side as seen from the front) of Lower case 6 of the housing 3 lie inside the corresponding front surface and right-side surface of the upper case 5 above the same. In other words, the width and depth of the lower case 6 are smaller than the width and depth of upper case 5, and the volume of lower case 6 is smaller than the volume of upper case 5. On the other hand, the left-side surface (the side surface on the left side as seen from the front) of lower case 6 matches the corresponding surface of upper case 5. Thus housing 3 is constructed asymmetrically about central chassis 4 (see FIGS. 2 and 6).

The plane surrounded by the front and sides of lower case 6 constitutes the lower surface that comes into contact with the floor surface (not shown). That is, the video game device 1 is set up in horizontal orientation extending horizontally, with the lower surface of the lower case 6 touching the surface of the floor.

Exposed on the front left side (the left side as seen from the front) of lower case 6 are data transfer terminal 19 and two external device connection terminals 20 (see FIG. 2) for connecting external devices.

Data transfer terminal 19 conforms to the IEEE 1394 standards, and by connecting a cable connected to this terminal to a digital camera or a video deck, etc., one can take into video game device 1 the picture and sound, etc. recorded with the digital camera or video deck.

The two external device connection terminals 20 conform to the USB (universal serial bus) standards and allow one to connect a keyboard or other input device, a mouse or other pointing device, a printer or other printing device, or an external memory device, etc. that employs a magnetooptical disk or other magnetic medium.

Formed on the front of lower case 6, along its longitudinal direction, are slit-like openings 6A for letting air taken from outside as cooling air into the interior of device 1.

As shown in FIGS. 3 and 4, central chassis 4 has, and is formed integrally with a rear surface part 41, which forms the rear surface of the video game device 1, and a board-like middle shelf 42 which is provided so as to be perpendicular to the middle part of the rear surface part 41 in the height direction.

Rear surface part 41, which covers the rear surface of housing 3, consists of an upper rear surface part 43 which is formed approximately in the shape of a rectangle and is long enough to block part of the rear surface of upper case 5, and a lower rear surface part 44, which is formed approximately in the shape of a rectangle and is long enough to block part of the rear surface of lower case 6.

As shown in FIG. 4, a rectangular notch 43A is formed near the right end edge shown in FIG. 3 of upper rear surface part 43 in FIG. 3. Arranged in this notch 43A are AC inlet 32A, which is a power supply terminal for supplying power from an external power source to main body 2, and a main power switch 32B which operates the supply of power from an external power supply.

Exposed near the right end edge of lower rear surface part 44 and below the notch 43A, is a video-audio output terminal 21 for outputting video, audio and other signals recorded on an optical disk to a television or other display device.

Exposed next to video-audio output terminal 21 is a communication terminal 22 for communicating with external devices. The communication terminal 22 conforms to the IrDA (Infrared Data Association) standards, which are standards for data communication using infrared rays, and if this terminal is provided on an external device, data can be transmitted and received by infrared communication, with no need to connect a cable, etc. between device 1 and the external device.

Exposed near the left end edge of lower rear surface part 44 in FIG. 3 is a PCMCIA slot 23, into which are inserted various card-type peripheral devices that conform to the PCMCIA standards, such as a memory card or modem card. A card-type peripheral device inserted into the PCMCIA (Personal Computer Memory Card international Association) slot 23 can be removed by pressing eject button 23A, which is exposed to the side of the PCMCIA slot 23.

Provided approximately in the center of rear surface part 41 is an exhaust opening 41A, through which the air inside video game device 1 is expelled.

A middle shelf 42 of central chassis 4 is formed in the shape of a board having approximately the same width as upper case 5 and approximately the same depth as the upper case 5, and it is provided at right angles at the interface part of upper rear surface part 43 and lower rear surface part 44.

A notch 42A for accommodating an exhaust fan 15 is formed in the part of the middle shelf 42 that corresponds to exhaust opening 41A provided in rear surface part 41.

(2) Internal Structure of the Video Game Device

Figure 6:
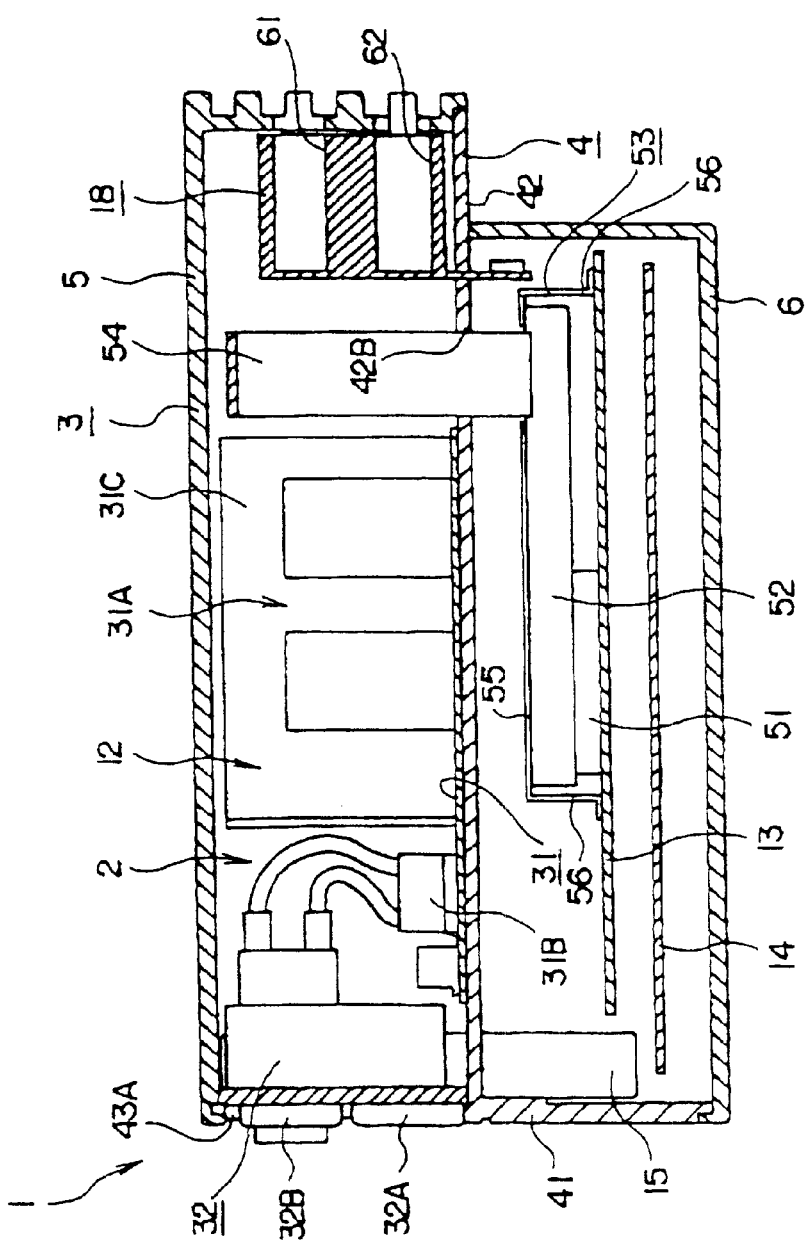
FIG. 6 is a cross-sectional view taken along line VI—VI of FIG. 5.
Figure 7:
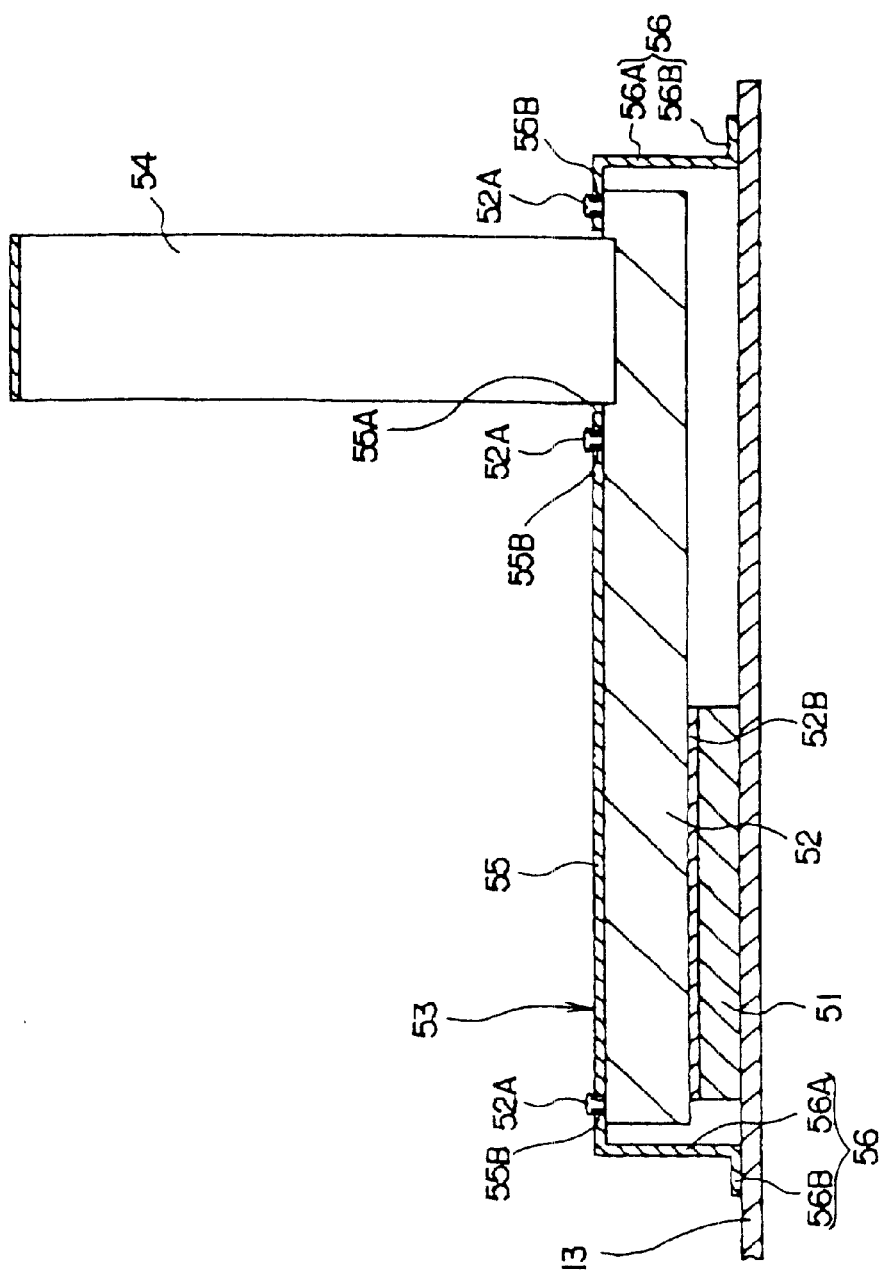
FIG. 7 is a cross-sectional view showing a heat radiation and shielding structure of a CPU of the electronic device.

FIGS. 5 to 7 show the internal structure of video game device 1. FIG. 5 is a schematic perspective view of the interior of video game device 1; FIG. 6 is a vertical cross-sectional view of video game device 1, and FIG. 7 is an enlarged cross-sectional view of the essential parts.

In the drawings, the main body 2, which is provided on center chassis 4, is built into the interior, which is enclosed by upper case 5 and lower case 6 of the housing 3.

The main body 2 includes a disk device 11, a power source unit 12, a main board 13, which is the main control circuit board, and an input-output signal control board 14, etc.

Here, the disk device 11 and power source unit 12 are arranged on the middle shelf 42 of central chassis 4, and the main board 13 and input-output signal control board 14 are arranged in layers in the space that is formed by middle shelf 42, which is located at the lower part of the interior of device 1, and the lower case 6. That is, disk device 11 and power source unit 12, and main board 13 and input-output signal control board 14 are arranged opposite each other with central chassis 14 therebetween.

Power source unit 12 has a power source circuit board 31, which is mounted on middle shelf 42 of central chassis 4, and a power source unit 32, into which electric power is input from an external power source.

Power source unit 32 has aforesaid AC inlet 32A and main power switch 32B, and is connected to power source circuit board 31 via a connector 31B. That is, electric power from an external power source is supplied to power source circuit board 31 through AC inlet 32A by turning on the main power switch 32B.

Power source circuit board 31 occupies approximately half the plane area of middle shelf 42, and electric power supplied from an external power source is converted to the prescribed voltage by capacitors, coils, transformers, and other circuit element 31A that make up the power source circuit board 31. Here, provided on power source circuit board 31 is a flat L-shaped guide plate 31C for directing in the prescribed direction the cooling air that is brought in through opening 6A formed in the front surface of the lower case 6.

In this way, power source unit 12 supplies to disk device 11 and boards 13, 14, etc. the power that is obtained by power source circuit board 31.

Attached on the side of exhaust outlet 41A of the power source unit 12 is the exhaust fan 15 in a position that corresponds to the exhaust outlet 41A. The exhaust fan 15 is also driven by the electric power from power source unit 12.

Arranged on the side of exhaust outlet 41A of power source unit 12 and near opening 6A on the opposite side are rectangular heat sinks 54 and slots 18 described below.

Disk device 11 which plays a CD-ROM, DVD-ROM, or other optical disk, includes a main body 11A, inside which an optical pickup unit (not shown) is accommodated, and the disk tray 11B, by which an optical disk is loaded onto the main body 11A, and it is placed on middle shelf 42 in the space next to power source unit 12.

The main board 13, which has a control system (not shown), includes a central processing unit (CPU) 51, that is a heat-generating component that emanates heat, and its peripheral devices, etc., a graphic system (not shown) consisting of image processing device that renders pictures, and a sound system (not shown) consisting of audio processing device that generates music and sound effects, etc., and the main board 13 is provided in a position closest to and opposite the lower surface of middle shelf 42.

The control system has the above mentioned CPU 51, a peripheral device controller that performs interrupt control and control of direct memory access (DMA) data transfers, etc., a main memory that consists of random access memory (RAM), and a read-only memory (ROM) in which are stored programs such as so-called operating system, which controls the main memory, graphic system, and sound system, etc. The "main memory" here refers to the memory in which programs can be executed.

CPU 51, which controls video game device 1 as a whole by executing the operating system stored in ROM, consists of, for example, a 128-bit RISC (reduced instruction set computer) CPU.

The graphic system has an image processing device that renders pictures under drawing instructions from CPU 51, and a frame buffer in which images rendered by this image processing device are stored.

The image processing device draws polygons, etc. to the frame buffer in accordance with drawing commands from CPU 51. The image processing device is able to draw up to about 75 million polygons per second.

The sound system has an audio processing device that plays background music and sound effects, etc. under instructions from CPU 51, and a sound buffer in which waveform data, etc. is stored by this audio processing device.

Attached to the top of CPU 51 by adhesive 52B is a heat conducting member 52 which is made of high-thermal-conductivity aluminum. Provided on the upper surface of this heat conducting member 52 are multiple T-shaped pins 52A spaced at prescribed intervals.

CPU 51 and heat conducting member 52 are covered by a shielding member 53 which is made of metal.

More specifically, shielding member 53 includes a flat shielding part 55, which comes into contact with the upper surface of heat conducting member 52, and side shielding parts 56 which have an L-shaped cross-section extending from both ends of the flat shielding part 55 to the upper surface of main board 13.

Formed on flat shielding part 55 are holes 55B, which are positioned to correspond to pins 52A provided on the upper surface of heat conducting member 52. That is, by inserting pins 52A into holes 55B and making the upper part of pins 52A protrude against the upper surface of the flat shielding part 55, the flat shielding part 55 is engaged by pins 52A and is anchored onto heat conducting member 52.

Each side shielding part 56 has a vertical part 56A, which extends downward from the end of flat shielding part 55, and horizontal part 56B, which extends horizontally outward from the end of the vertical part 56A and whose lower surface comes into contact with the upper surface of main board 13.

Providing the shielding member 53 makes it easy to prevent outside disturbances such as noise generated from input-output signal control board 14 or power source unit 12 from intruding into CPU 51, and makes it possible to securely maintain the stable operation of CPU 51.

Provided on the upper surface of the end of heat conducting member 52 is a rectangular heat sink 54, which is a cooling member that absorbs heat emitted from the CPU and radiates heat into the interior of video game device 1. The rectangular heat sink 54 extends from the upper surface of heat conducting member 52 to near the top of upper case 5, and has a large surface area. Thus, as shown in FIGS. 4 and 7, openings 42B, 55A are formed in the middle shelf 42 and the flat shielding part 55 in positions corresponding to where rectangular heat sink 54 is provided.

The rectangular heat sink 54 is arranged on the side of lower case opening 6A from the power source unit 12.

Thus, by transmitting heat generated by CPU 51 along the heat conducting member 52 and rectangular heat sink 54 and dissipating it within device 1, the CPU 51 can be cooled in a simple manner. Meanwhile, by taking in cooling air through opening 6A and exhausting the heat that builds up within device 1 outside of the video game device 1 by means of exhaust fan 15, the cooling effect on CPU 51 is easily improved.

An input-output signal control board 14, which is arranged below the main board 13, has an optical disk controller (not shown) that performs control of the optical disk on which application programs are recorded, as well as a communication controller (not shown) that controls the input and output, etc. of signals from the controller into which instructions from the users are input, signals that are output to the controller, and data from external auxiliary memory devices that store video game settings, etc.

The optical disk controller has a decoder that decodes the programs and data, etc. that are recorded with, for example, an appended error correction code (ECC), and a buffer that speeds up the reading of data from the optical disk by temporarily storing data from disk device 11.

Electrically connected to the communication controller is are, though not shown, one ends of slots 18, each of which consists of controller connection unit 62 and the memory card insertion unit 6. With these units are controlled the input and output of signals from the controller into which instructions from the users are input, signals that are output to the controller, and data from external auxiliary memory devices that store video game settings, etc. Also electrically connected to the communication controller are, besides slots 18, the data transfer terminal 19, external device connection terminal 20, communication terminal 22, and PCMCIA slot 23, etc., by which the communication controller also controls the input and output of signals with external devices, etc. connected to and inserted into those terminals, etc.

In the video game device 1 having the above described internal structure when main power switch 32B is turned on and power switch 16 is pressed, CPU 51 executes the operating system recorded in the ROM to thereby control the video game device 1. Thereafter, CPU 51 controls the graphic system, sound system, etc.

When the operating system is executed, CPU 51 initializes the video game device 1 as a whole, including confirming its operation, etc., then controls the disk device 11 and executes a game or other application program recorded on the optical disk. By executing this game or other program, CPU 51 controls the graphic system and sound system, etc. in accordance with input from the users and controls the display of images and the generation of sound effects and background music.

Next, the air channels inside the video game device 1 will be described in detail.

As shown by arrows in FIGS. 1 and 3, formed in the video game device 1 are cooling air intake channel 71 which is mainly a cooling channel, and an exhaust channel 72. But the air that flows through channels 71, 72 does not strictly flow along the arrows shown in the drawings, but is rather sucked in and discharged approximately as shown by the arrows, through gaps between the constituent parts of the device.

Cooling air intake channel 71 is a cooling air channel in which cooling air is sucked into the interior of device 1 through opening 6A in the lower case 6. The cooling air cools CPU 51 and rectangular heat sink 54, etc., and then is exhausted to the exterior of device 1 by exhaust fan 15 through the exhaust channel 72.

The exhaust channel 72 has a first exhaust channel 73 which is formed between the lower surface of middle shelf 42 and the interior lower surface of the lower case 6, and a second exhaust channel 74 which is formed between the upper surface of middle shelf 42 and the interior upper surface of the upper case 5. The first exhaust channel 73, which cools CPU 51, passes below the middle shelf 42 and is discharged to the exterior of video game device 1 through the exhaust opening 41A by exhaust fan 15.

The second device exhaust channel 74 cools the rectangular sink 54; part of the cooling air that passes through the first exhaust channel 73 gets in above the middle shelf 42 through the opening 42B and passes over the power source circuit board 31 of the power source unit 12, is directed by a guide plate 31C to the exhaust fan 15, and is discharged to the exterior of video game device 1 through exhaust opening 41A by exhaust fan 15. That is, rectangular heat sink 54 is positioned in the cooling channel upstream of power source unit 12.

The cooling air that flows through the second exhaust channel 74 is supplied from, besides what comes in through opening 6A, memory card insertion unit 61 and controller connection unit 62.

By having the above-described cooling channels, CPU 51, etc. is cooled as follows:

First, the heat generated by CPU 51 is transmitted along a heat conducting member 52, and then sucked into rectangular heat sink 54. The heat is dissipated inside device 1 from the heat sink 54. The heat that is released is discharged by exhaust fan 15 outside of the video game device 1, together with heat generated from power source unit 12 and heat generated from disk device 11.

Meanwhile, rectangular sink 54, CPU 51, and power source unit 12, etc. are cooled by the cooling air sucked into video game device 1 through opening 6A. After the cooling air has cooled the interior of video game device 1, it is directed by guide plate 31C, etc. and is exhausted through exhaust opening 41A to the rear side of video game device 1 by exhaust fan 15.

(3) Housing Assembly Structure

Figure 8:
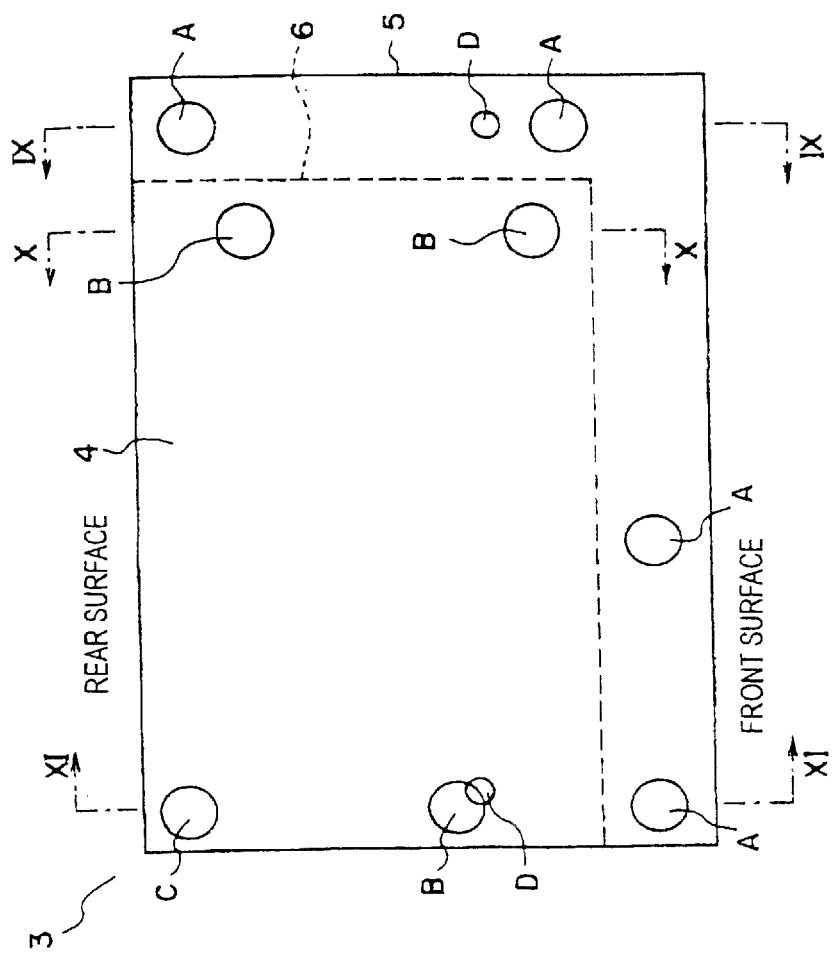
FIG. 8 is a schematic, plan view showing connection positions of an upper case, central chassis, and a lower case of the housing shown in FIG. 4.
Figure 9:
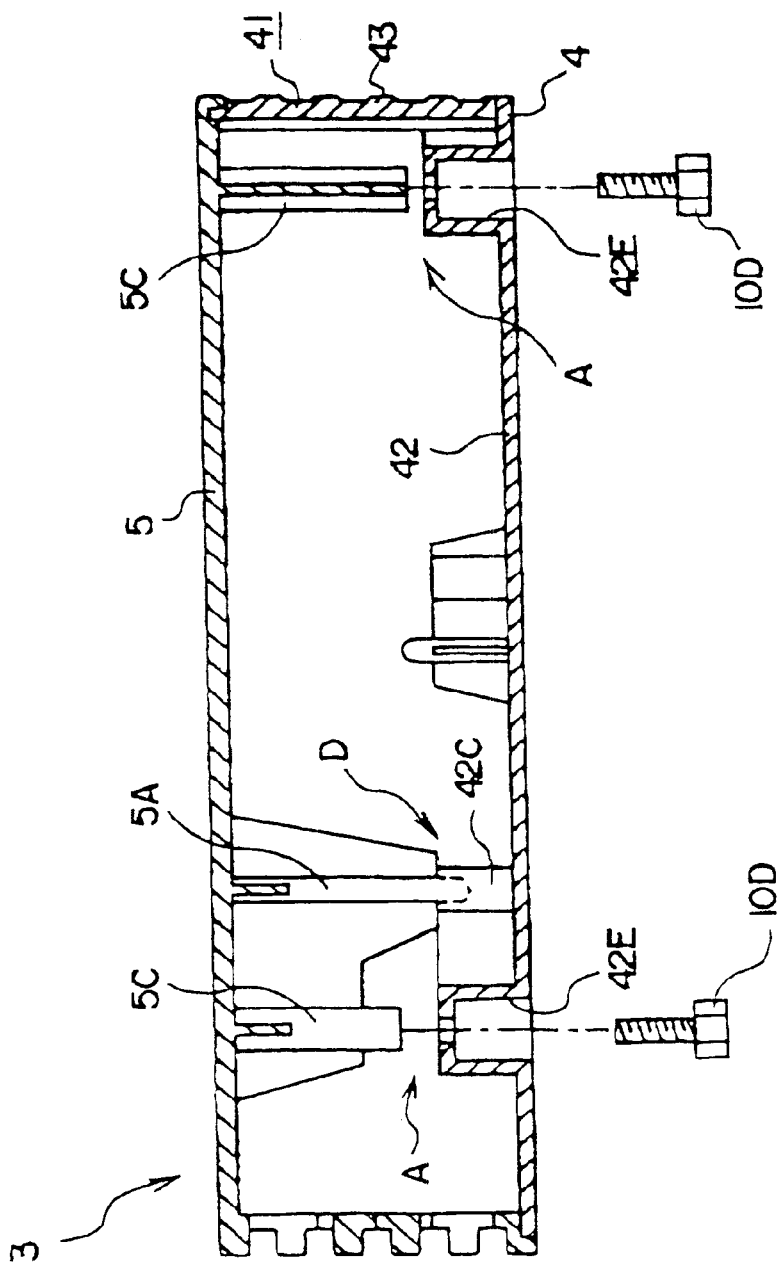
FIG. 9 is a cross-sectional view of an upper part of the device taken along line IX—IX of FIG. 8.
Figure 10:
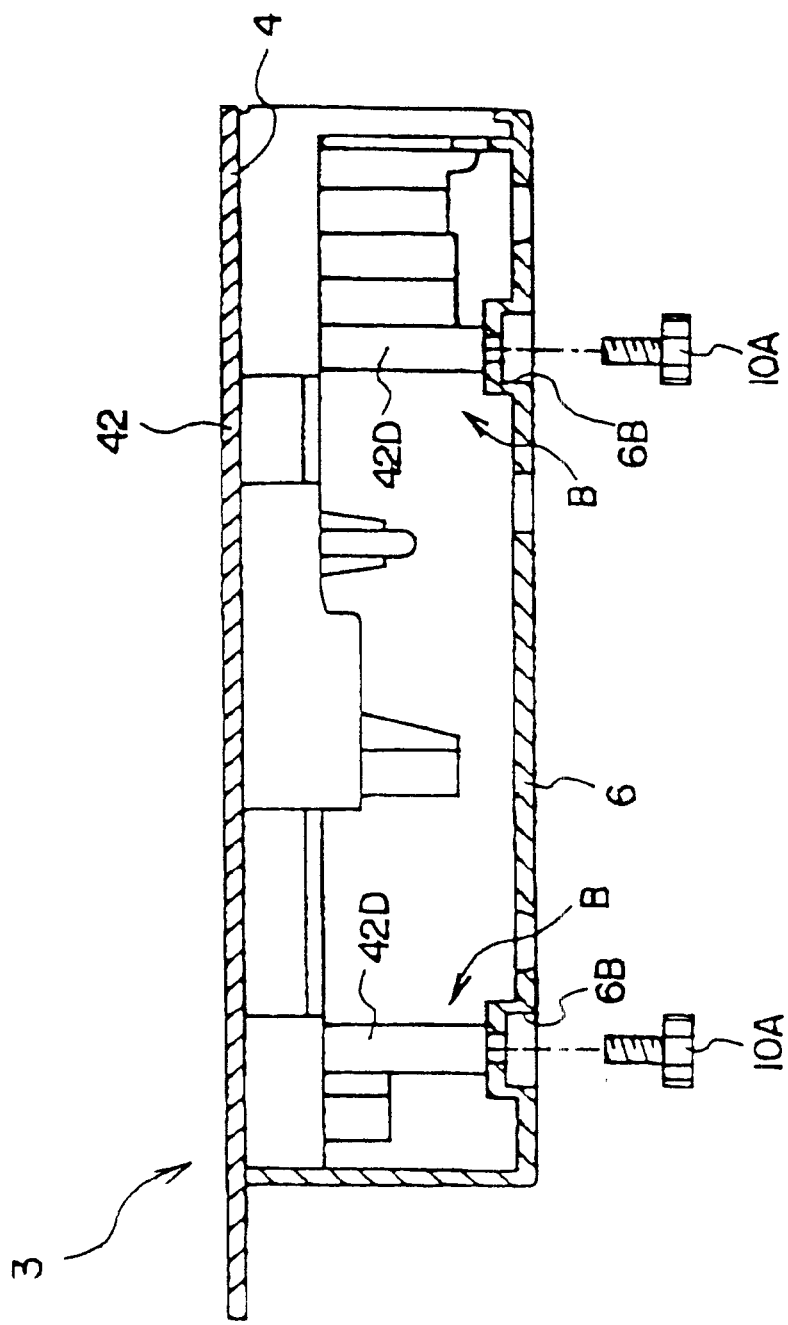
FIG. 10 is a cross-sectional view of a lower part of the device taken along line X—X of FIG. 8.
Figure 11:
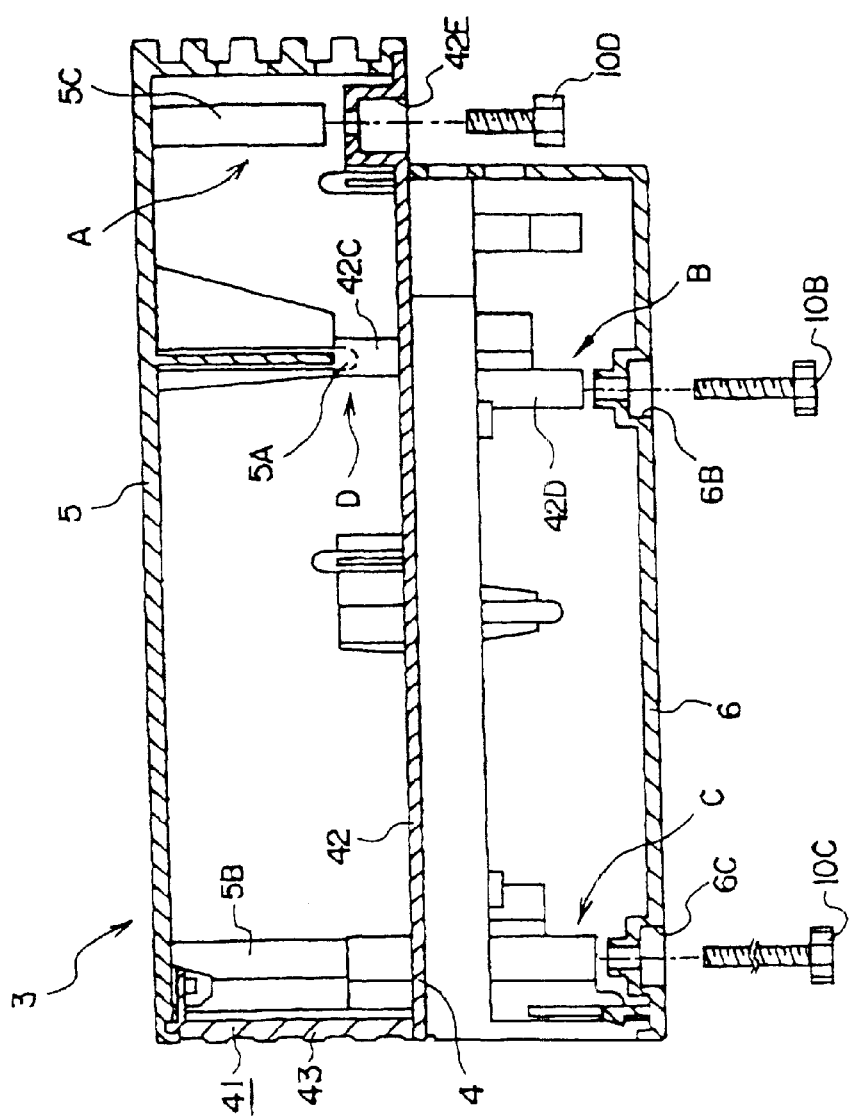
FIG. 11 is a cross-sectional view taken along line XI—XI of FIG. 8.

FIGS. 8 to 11 show the assembly structure of housing 3. FIG. 8 is a schematic diagram showing connection of upper case 5, central chassis 4, and lower case 6. FIGS. 9 and 10 are cross-sectional views seen from the right front side, and FIG. 11 is a cross-sectional view seen from the left front side.

Provided on the inside surface of upper case 5 are rod-like protrusions 5A pointing toward central chassis 4, as shown in FIG. 9. The tips of protrusions 5A fit into receptacles 42C which are fixed to the upper surface of central chassis 4 (the places shown by circles D in FIG. 8).

Multiple screw holes 42E into which screws 10D are to be inserted, are formed in the lower surface of central chassis 4. Arranged above screw holes 42E are spacers 5C that protrude downward from the inside surface of the upper case. Threading is formed inside these spacers 5C (the places shown by circles A in FIG. 8).

That is, upper case 5 and central chassis 4 are made integral by fitting together protrusions 5A and receptacles 42C, inserting screws 10D through screw holes 42E, and screwing the screws 10D into the threading of spacers 5C.

As shown in FIG. 10, multiple screw holes 6B into which screws 10A, 10B are to be inserted, are formed on the lower surface of lower case 6. Arranged above these screw holes 6B are spacers 42D that protrude downward from the lower surface of central chassis 4. Threading is formed inside these spacers 42D. Therefore lower case 6 and central chassis 4 are made integral by inserting screws 10A, 10B through screw holes 6B and screwing said screws 10A, 10B into the threading of spacers 42D (the places shown by circles B in FIG. 8).

As shown in FIG. 11, above some of screw holes 6B, specifically above screw hole 6C, there is provided a through spacer 5B that protrudes from the inside surface of upper case 5 through central chassis 4 to the screw hole 6C. That is, lower case 6, central chassis 4, and upper case 5 are integrally connected (made integral) by putting screw 10C through this screw hole 6C and screwing said screw 10C into the threading of through spacer 5B (the place shown by circle C in FIG. 8).

The above-described embodiment of the invention has the following effects:

Because rectangular heat sink 54 is placed upstream in the cooling channel from power source unit 12, low-temperature cooling air that does not contain the heat emitted from power source unit 12 can be blown onto rectangular heat sink 54, which makes it possible to efficiently cool CPU 51 and other heat-generating components of the device. Also, because the CPU can be cooled efficiently, the device can be made smaller as compared to conventional video games devices of the type under consideration.

Because rectangular heat sink 54 is used, which has a large surface area, heat is actively absorbed and released by the rectangular heat sink 54, thereby further improving the efficiency with which CPU 51 and the other heat-generating components are cooled.

In addition, because rectangular heat sink 54 and CPU 51 are connected by heat conducting member 52, the conduction of heat from CPU 51 to rectangular heat sink 54 is promoted by the heat conducting member.

Since the rectangular heat sink 54 and CPU 51 can be securely connected by heat conducting member 52, the cooling of CPU 151 can be ensured.

In addition, because CPU 51 is positioned at the bottom of the interior of video game device 1, heat emitted by CPU 51 can be allowed to escape to the top of the interior of device 1, which can promote the cooling of CPU 51. This can improve the cooling efficiency of CPU 51. Since the cooling of CPU 51 can be done efficiently, device 1 can be made smaller.

The present invention is not limited to the above-described embodiment but includes other constructions, etc. that can achieve the purpose of the invention.

Modifications such as the following are also included in the present invention:

For example, if CPU 51 and rectangular heat sink 54 are provided so that they touch one another, they need not be connected via heat conducting member 52.

And the cooling member is not limited to rectangular heat sink 54; for example, a heat exchange element having a heat-absorbing surface and a heat-radiating surface may be provided on CPU 51. A cooling fan may be provided on the inside surface of opening 6A to forcibly blow air from outside onto CPU 51. In short, the shape, composition, etc. may be any that serve the purpose of cooling CPU 51.

As described above, the electronic device of this invention has the effects of being able to efficiently cool heat-generating components and allowing smaller size.

What is claimed is:

1. An electronic device comprising:
   a housing that has a rectangular parallelepiped shape having a thin dimension in a height direction thereof;
   a central chassis positioned inside said housing, in the middle part of said housing in said height direction, said central chassis having a shelf that separates said housing into an upper section and a lower section;
   heat-generating components positioned in said lower section within said housing relative to said central chassis and a heat-conducting member connected to said heat-generating components for conducting heat away from said heat-generating components;
   a heat sink member extending through a first opening in said shelf between said upper and lower sections and thermally connected to said heat-generating components via said heat-conducting member;
   a power source unit provided on said upper section, said power source unit for providing power to said electronic device;
   an exhaust fan provided on a side end of said housing;

a second opening provided in said housing on a side end opposite said exhaust fan; and first and second cooling air channels extending between said exhaust fan and said second opening;
wherein said first cooling air channel is formed in said lower section with respect to said central chassis, and
wherein said second cooling air channel is formed in said upper section with respect to said central chassis, said heat sink member being positioned in said second cooling air channel at a location that is upstream from said power source unit.

2. An electronic device in accordance with claim 1, wherein said heat-generating components include a CPU.

3. An electronic device in accordance with claim 1, wherein a portion of said first cooling air channel extends into said upper section of said housing via said first opening in said shelf.

4. An electronic device in accordance with claim 3, further comprising a guide plate positioned on said upper section for directing said portion of said first cooling air over said power source unit.

5. An electronic device in accordance with claim 1, further comprising a third opening provided on said shelf for accommodating said exhaust fan, said exhaust fax extending between said upper and lower sections of said housing through said third opening.

6. An electronic device in accordance with claim 1, wherein said second opening further comprises a memory card insertion unit.

7. An electronic device in accordance with claim 1, wherein said second opening further comprises a controller connection unit.

8. An electronic device in accordance with claim 6, wherein said second opening further comprises a controller connection unit.

9. An electronic device in accordance with claim 1, wherein said first and second cooling air channels function in an identical manner irrespective of whether said housing is positioned horizontally or vertically.

* * * * *